(12) United States Patent
Bosch (10) Patent No.: US 9,401,575 B2
(45) Date of Patent: Jul. 26, 2016

(54) METHOD OF ASSEMBLING A TRANSDUCER ASSEMBLY

(71) Applicant: Sonion Nederland BV, Hoofddorp (NL)

(72) Inventor: Jozef Johannes Gerardus Bosch, Ouderkerk aan de Amstel (NL)

(73) Assignee: Sonion Nederland BV, Hoofddorp (NL)

(*) Notice: Subject to any disclaimer, the term of this patent is extended or adjusted under 35 U.S.C. 154(b) by 0 days.

(21) Appl. No.: 14/284,621

(22) Filed: May 22, 2014

(65) Prior Publication Data

US 2014/0353031 A1 Dec. 4, 2014

(30) Foreign Application Priority Data

May 29, 2013 (DK) .................................. 2013 70292

(51) Int. Cl.
*H01R 4/02* (2006.01)
*H01R 43/00* (2006.01)
*H05K 3/34* (2006.01)
*H05K 1/11* (2006.01)
*H05K 1/18* (2006.01)
*H05K 3/32* (2006.01)
*H05K 3/30* (2006.01)

(52) U.S. Cl.
CPC ................ *H01R 43/00* (2013.01); *H01R 4/027* (2013.01); *H01R 4/028* (2013.01); *H05K 1/118* (2013.01); *H05K 3/3436* (2013.01); *H05K 1/189* (2013.01); *H05K 3/303* (2013.01); *H05K 3/325* (2013.01); *H05K 2201/094* (2013.01); *H05K 2201/0969* (2013.01); *H05K 2201/09854* (2013.01); *H05K 2201/10083* (2013.01); *H05K 2203/167* (2013.01); *H05K 2203/168* (2013.01); *Y02P 70/613* (2015.11); *Y10T 29/49005* (2015.01)

(58) Field of Classification Search
CPC ................................ H01R 4/027; H01R 4/028
USPC ........................................................ 174/549
See application file for complete search history.

(56) References Cited

U.S. PATENT DOCUMENTS 4,691,418 A 9/1987 Ingle et al.
6,788,796 B1 9/2004 Miles et al.
(Continued)

FOREIGN PATENT DOCUMENTS

EP 0796034 A2 9/1997
EP 2222149 A1 8/2010
GB 2162639 A 2/1986

OTHER PUBLICATIONS

Search Report corresponding to co-pending Danish Patent Application Serial No. PA201370292, Danish Patent Office, dated Jan. 11, 2014; (4 pages).

(Continued)

*Primary Examiner* — Hung V Ngo
(74) *Attorney, Agent, or Firm* — Nixon Peabody LLP (57) ABSTRACT

A method of assembling a transducer assembly comprising a transducer and a conductor element, where one of the transducer and the conductor element includes holes and conducting parts, each conducting part being exposed in or at a hole and the other of the transducer and the conductor element includes elevated, electrically conducting elements. The method includes aligning the conductor element and the transducer so that each of the elevated elements extends into a separate hole of the holes and fixing the transducer to the conductor element by fixing each elevated element to the conducting parts of the pertaining hole.

17 Claims, 3 Drawing Sheets

(56) References Cited

U.S. PATENT DOCUMENTS

| | | |
|---|---|---|
| 6,831,577 B1 | 12/2004 | Furst |
| 6,853,290 B2 | 2/2005 | Jorgensen et al. |
| 6,859,542 B2 | 2/2005 | Johannsen et al. |
| 6,888,408 B2 | 5/2005 | Furst et al. |
| 6,914,992 B1 | 7/2005 | van Halteren et al. |
| 6,919,519 B2 | 7/2005 | Ravnkilde et al. |
| 6,930,259 B1 | 8/2005 | Jorgensen et al. |
| 6,943,308 B2 | 9/2005 | Ravnkilde et al. |
| 6,974,921 B2 | 12/2005 | Jorgensen et al. |
| 7,008,271 B2 | 3/2006 | Jorgensen |
| 7,012,200 B2 | 3/2006 | Moller |
| 7,062,058 B2 | 6/2006 | Steeman et al. |
| 7,062,063 B2 | 6/2006 | Hansen et al. |
| 7,072,482 B2 | 7/2006 | Van Doorn et al. |
| 7,088,839 B2 | 8/2006 | Geschiere et al. |
| 7,110,560 B2 | 9/2006 | Stenberg |
| 7,136,496 B2 | 11/2006 | van Halteren et al. |
| 7,142,682 B2 | 11/2006 | Mullenborn et al. |
| 7,181,035 B2 | 2/2007 | van Halteren et al. |
| 7,190,803 B2 | 3/2007 | van Halteren |
| 7,206,428 B2 | 4/2007 | Geschiere et al. |
| 7,221,767 B2 | 5/2007 | Mullenborn et al. |
| 7,221,769 B1 | 5/2007 | Jorgensen |
| 7,227,968 B2 | 6/2007 | van Halteren et al. |
| 7,239,714 B2 | 7/2007 | de Blok et al. |
| 7,245,734 B2 | 7/2007 | Niederdraenk |
| 7,254,248 B2 | 8/2007 | Johannsen et al. |
| 7,286,680 B2 | 10/2007 | Steeman et al. |
| 7,292,700 B1 | 11/2007 | Engbert et al. |
| 7,292,876 B2 | 11/2007 | Bosch et al. |
| 7,336,794 B2 | 2/2008 | Furst et al. |
| 7,376,240 B2 | 5/2008 | Hansen et al. |
| 7,403,630 B2 | 7/2008 | Jorgensen et al. |
| 7,415,121 B2 | 8/2008 | Mögelin et al. |
| 7,425,196 B2 | 9/2008 | Jorgensen et al. |
| 7,460,681 B2 | 12/2008 | Geschiere et al. |
| 7,466,835 B2 | 12/2008 | Stenberg et al. |
| 7,492,919 B2 | 2/2009 | Engbert et al. |
| 7,548,626 B2 | 6/2009 | Stenberg et al. |
| 7,657,048 B2 | 2/2010 | van Halteren et al. |
| 7,684,575 B2 | 3/2010 | van Halteren et al. |
| 7,706,561 B2 | 4/2010 | Wilmink et al. |
| 7,715,583 B2 | 5/2010 | Van Halteren et al. |
| 7,728,237 B2 | 6/2010 | Pedersen et al. |
| 7,809,151 B2 | 10/2010 | Van Halteren et al. |
| 7,822,218 B2 | 10/2010 | Van Halteren |
| 7,899,203 B2 | 3/2011 | Van Halteren et al. |
| 7,912,240 B2 | 3/2011 | Madaffari et al. |
| 7,946,890 B1 | 5/2011 | Bondo et al. |
| 7,953,241 B2 | 5/2011 | Jorgensen et al. |
| 7,961,899 B2 | 6/2011 | Van Halteren et al. |
| 7,970,161 B2 | 6/2011 | van Halteren |
| 8,098,854 B2 | 1/2012 | van Halteren et al. |
| 8,101,876 B2 | 1/2012 | Andreasen et al. |
| 8,103,039 B2 | 1/2012 | van Halteren et al. |
| 8,160,290 B2 | 4/2012 | Jorgensen et al. |
| 8,170,249 B2 | 5/2012 | Halteren |
| 8,189,804 B2 | 5/2012 | Hruza |
| 8,189,820 B2 | 5/2012 | Wang |
| 8,223,996 B2 | 7/2012 | Beekman et al. |
| 8,233,652 B2 | 7/2012 | Jorgensen et al. |
| 8,259,963 B2 | 9/2012 | Stenberg et al. |
| 8,259,976 B2 | 9/2012 | van Halteren |
| 8,259,977 B2 | 9/2012 | Jorgensen et al. |
| 8,280,082 B2 | 10/2012 | van Halteren et al. |
| 8,284,966 B2 | 10/2012 | Wilk et al. |
| 8,313,336 B2 | 11/2012 | Bondo et al. |
| 8,315,422 B2 | 11/2012 | van Halteren et al. |
| 8,331,595 B2 | 12/2012 | van Halteren |
| 8,369,552 B2 | 2/2013 | Engbert et al. |
| 8,379,899 B2 | 2/2013 | van Halteren |
| 8,509,468 B2 | 8/2013 | van Halteren et al. |
| 8,526,651 B2 | 9/2013 | Lafort et al. |
| 8,526,652 B2 | 9/2013 | Ambrose et al. |
| 2003/0111727 A1 | 6/2003 | Kurusu |
| 2004/0056647 A1 | 3/2004 | Stauth et al. |
| 2007/0001318 A1 | 1/2007 | Starkston et al. |
| 2008/0064232 A1 | 3/2008 | Reiss et al. |
| 2010/0054514 A1* | 3/2010 | Chan .................. H05K 1/118 381/328 |
| 2011/0182453 A1 | 7/2011 | van Hal et al. |
| 2011/0189880 A1 | 8/2011 | Bondo et al. |
| 2011/0299708 A1 | 12/2011 | Bondo et al. |
| 2011/0299712 A1 | 12/2011 | Bondo et al. |
| 2011/0311069 A1 | 12/2011 | Ambrose et al. |
| 2012/0014548 A1 | 1/2012 | van Halteren |
| 2012/0027245 A1 | 2/2012 | van Halteren et al. |
| 2012/0140966 A1 | 6/2012 | Mocking et al. |
| 2012/0155683 A1 | 6/2012 | van Halteren |
| 2012/0155694 A1 | 6/2012 | Reeuwijk et al. |
| 2012/0255805 A1 | 10/2012 | van Halteren et al. |
| 2013/0028451 A1 | 1/2013 | de Roo |
| 2013/0136284 A1 | 5/2013 | van Hal et al. |
| 2013/0142370 A1 | 6/2013 | Engbert et al. |
| 2013/0163799 A1 | 6/2013 | Van Halteren |
| 2013/0195295 A1 | 8/2013 | van Halteren et al. |

OTHER PUBLICATIONS

European Search Report corresponding to co-pending EuropeanPatent Application Serial No. EP14169819, European Patent Office, dated Sep. 30, 2014; (2 pages).

Gore K P et al: "Mechanical Alignment of C5 ICS With Three Corner Peg Concept Using Larger Solder Spheres". Motorola Technical Developments. Motorola Inc. Schaumburg. Illinois. US. vol. 14, Dec. 1, 1991. pp. 27-28. XP000276140. ISSN: 0887-5286.

"Apparatus for Solder Ball Alignment and Containment". IBM Technical Disclosure Bulletin. International Business Machines Corp. (Thornwood). US. vol • 38. No. 12, Dec. 1, 1995. p. 307. XP000588150. ISSN: 0018-8689.

* cited by examiner

METHOD OF ASSEMBLING A TRANSDUCER ASSEMBLY

CROSS-REFERENCE TO RELATED APPLICATION

This application claims the benefit of Danish Patent Application Serial No. PA201370292, filed May 29, 2013, and titled "A Method of Assembling a Transducer Assembly," which is incorporated herein by reference in its entirety.

FIELD OF THE INVENTION

The present invention relates to a method of assembling a transducer assembly and in particular a manner of obtaining swift and reproducible interconnection between a transducer and a conductor element.

BACKGROUND OF THE INVENTION

Figure 1:
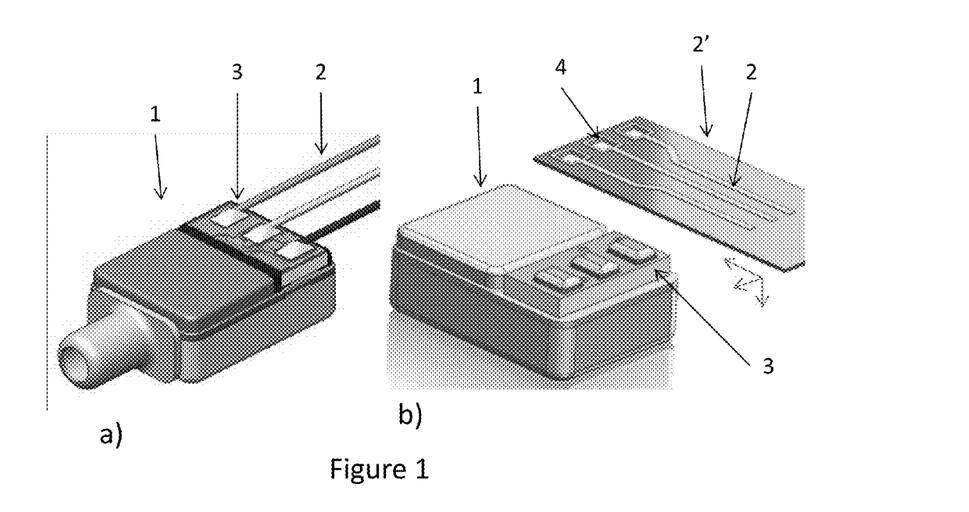
FIG. 1 illustrates two prior art methods of providing electrical connections to a transducer.

In FIG. 1, prior art assemblies are illustrated where electrical connection to a transducer 1 is made using, in a), three wires 2 each soldered to solder bumps 3 of the transducer.

The set-up of a) has the disadvantages that it is difficult to automate and that rather large solder bumps or soldering pads are required, thus requiring a large amount of heating.

In b), the conductors 2 form part of a flex print 2' having openings 4 each surrounded by a part of the pertaining conductor 2, and the transducer 1 has solder bumps 3. Fixing of the transducer 1 to the flex print 2' is performed by attempting to position the flex print 2' in relation to the transducer 1 so that the solder bumps 3 and the openings 4 are aligned.

Because the solder bumps 3 are larger than the holes 4 and everything, when the transducer 1 is e.g. intended for use in hearing aids, is too small to add optical targets (so-called "fiducials"), the positioning is presently done either based on the outside lines of the flex 4 and transducer (suffering from a large tolerance build-up) or based on looking through the flex-holes 4 (which is actually 'blind' once the holes are over the larger solder bumps).

The transducer 1 and flex print 2' must then be fixed (in three dimensions) while soldering is performed.

Especially in lead-free systems, flux-less soldering is problematic, whereby it is preferred to add some flux, solder paste or flux-core solder. Also, for sufficient solder-wetting, it is preferred that the applied flux sufficiently contacts the solder bump as well as the flex hole contact area. Since the flex is preferably rather thick compared to the hole-size (relatively deep hole), it is difficult to dispense the flux correctly. Checking visually after dispensing is also difficult, as the flex is positioned over the solder bumps. This check is, however, desired, as flux is not allowed to enter on to the surface between the solder bumps 3, as this brings about a risk of short-circuit and corrosion.

Having added the flux, the soldering is to be performed. This soldering is performed through the flex print 2', as the solder bumps 3 are larger than the openings 4, and must comprise heating sufficiently to melt the solder bumps 3. This heating may bring about a number of problems, such as damage to the transducer, melting and short circuiting of the solder bumps 3, damage to the flex print, etc. Furthermore, there is a considerable risk of partial melting and bad wetting due to inhomogeneous heat transfer, bringing about an insufficient solder connection quality.

A further complication is that, during soldering, the flex should be kept in the desired position, but a pressed-down flex mounted on this type of solder bumps will usually slant or bend as all solder bumps are not melted simultaneously, but consecutively due to the process of applying heat. As the flex print has three degrees of movement as indicated by the coordinate system in FIG. 1b, it may slant in any of the directions indicated.

Finally, it is noted that the connection built with flex and the solder bumps 3 has the flex cover a large part of the solder bumps 3 and the space between the bumps 3. Thus, visual inspection is made quite difficult, whereby there is a considerable risk that a low wetting quality is not spotted, and that short circuits between bumps 3 and flux residues between bumps 3 goes unnoticed (unused flux is etching and causes corrosion risks in the field and burned flux causes a risk for brittle solder connections).

SUMMARY OF INVENTION

It is an object of the invention to provide a better, safer, swifter and more reproducible interconnection between the transducer and a conductor element.

A first aspect, the invention relates to a method of assembling a transducer assembly comprising a transducer and a conductor element, wherein:

one of the transducer and the conductor element comprises a plurality of holes and conducting parts, each conducting part being exposed in or at a hole and the other of the transducer and the conductor element comprises a plurality of elevated, electrically conducting elements, the method comprising:

aligning the conductor element and the transducer so that each of the elevated elements extends into a separate hole of the hole and fixing the transducer to the conductor element by fixing each elevated element to the conducting parts of the pertaining hole.

In this context, an assembly is a combination of at least two elements which, before attachment, are individual elements and which, after attachment may or may not be separable again.

A transducer may be an element adapted to convert sound into an electrical signal, such as a microphone, or vice versa, such as a loudspeaker or a receiver, which in the hearing aid field is a sound generator. The transducer may be a miniaturized element, such as an element having no side exceeding 10 mm. Some transducers are adapted to be positioned within the ear canal of persons and thus have sides smaller than 4 mm.

The signals for or to the transducer may, in addition to or alternatively to power, be transported to/from the transducer via the conducting parts of the conducting elements. Power to a transducer may be provided from a power source, such as a battery, and signals to/from a transducer may be provided from or to a signal processor, an amplifier or the like. The conductor element thus may also be connected to or connectable to one or more of a power source, a signal processor and/or an amplifier.

A conductor element is an element having a plurality of conducting parts, which usually will be elongate parts configured to convey signals and/or power to/from the transducer via the elevated elements.

The number of holes may be adapted to the individual use. In some situations, a single signal is to be fed to or received from the transducer, so that two conducting parts and two holes suffice. In other situations, three, four or even more conducting parts and holes are desired.

Preferably, the conductor element is a flat element wherein the holes or elevated elements are provided at predetermined positions in a predetermined plane, such as a plane of a surface of the conductor element or transducer wherein the holes are provided. Then, the elevated elements are preferably provided in corresponding positions in a predetermined plane, such as a plane of a surface of the conductor element or transducer wherein or where on the elevated elements are provided.

In this situation, when positioning the elevated elements and holes of two pairs correctly in relation to each other, the remaining pairs of an elevated element and a hole will automatically be positioned correctly. In addition, the fact that the elevated elements fit inside the holes make this registering quite easy.

When each conducting part is exposed in or at a hole, it may be contacted directly by the elevated element when positioned in the hole. Alternatively, a conductive element, such as solder or a conductive paste or glue may be provided in or at the hole to provide this electrical connection between the conductive part and the elevated element.

If the hole is a through-going hole, the elevated element may be introduced from one end of the through-going hole and other elements, such as a solder or glue, from the other end while the elevated element is present in the hole.

If the hole is not a through-going hole, such as a blind bore, any solder/glue or the like may be added to the hole or elevated element, before the elevated element is introduced into the hole.

As described below, press fitting may be an alternative, such as a press fitting deforming the hole and/or elevated element so as to gain a better and more lasting contact/engagement. In one situation, no further elements are required to provide the press fitting. In another situation, a particular deformation is desired of e.g. the elevated element, such as if a sharp or blunt element is forced into the elevated element to force parts thereof away from a centre and toward the sides of the hole. This sharp/blunt element may be introduced from one end, if the hole is through-going or may be initially present in the hole (before introduction of the elevated element) if the hole is not through-going. In yet another situation, the elevated elements may be provided with a pre-tinning layer that eases the press-fit.

Whether the elevated elements are provided on the conductor element or the transducer is not important.

In this context, an elevated element is an element which, compared to a surface on which it is provided, has a convex shape. Preferably all elevated elements are provided on a flat surface from which all elements extend in the same direction.

The shapes of the elevated elements may be the same or may differ. It may be desired to provide different shapes or sizes in order to ensure that the correct pairs of a hole and an elevated element are formed.

The fixing step comprises fixing each elevated element to the conducting parts of the pertaining hole. Naturally, an even better fixing or attachment may be performed when also other parts, such as other parts of the conductive element, of the conductive element and transducer take part in the engagement.

As will be described below, a number of different manners of fixing are possible, such as soldering, welding, glue, press-fitting, and deformation.

The aligning step may be quite simple in that it comprises having each of the elevated elements extend into a separate hole of the holes. If just one elevated element is provided inside the correct hole, two degrees of freedom have been removed, and the remaining elevated elements may be brought to the correct position with a simple rotation.

Naturally, it is desired that the elevated elements fit inside the pertaining hole. This may, however, be a press fitting or a fit where the elevated element and/or the hole is deformed.

Thus, usually, the elevated element will, in a predetermined plane, have an outer contour fitting inside that of the hole, seen in a predetermined plane which usually will be perpendicular to a centre axis of the hole and/or be a plane of a surface into which the hole opens. To obtain a press fit, the outline of the elevated element may, in at least two positions, touch that of the hole.

If a deformation is desired, at least parts of the outline of the elevated element is outside that of the hole, before the elevated element is introduced in the hole.

Naturally, any overall shape may be used for the elevated elements and the holes.

It may be desired to use different shapes for different pairs of hole and elevated element in order to more clearly indicate which elevated element goes into which hole.

Different sizes may also be desired.

It is noted that a round elevated element may be provided in a hole with a quadrangular, triangular, elliptical, diamond, star shape or the like, and that an elevated element with a quadrangular, triangular, elliptical, diamond, star shape or the like may fit inside a hole with a circular shape. The hole may have an outline with any geometrical shape, as may the elevated element, as long as the elevated element is dimensioned to fit within the hole to the desired degree.

In some instances, it is desired that the contour of the elevated element of a pair matches that of the pertaining hole to a large degree so that either a high engagement force may be obtained using a press fit or when further deforming the elevated element. Another advantage thereof is that only a little of a fluid, such as solder or a glue, is required to fill a space between the elevated element and the inner surface of the hole due to capillary forces.

In a particular embodiment, the distance or space between the inner hole surface and the elevated element may be adapted to attract and hold a fluid, such as solder or glue, without transporting this liquid through the hole and to other parts of the conductor element and/or the transducer.

Thus, it may be desired that, over at least 10%, such as at least 15%, such as at least 20%, such as at least 25%, such as over at least 30%, such as at least 35%, such as at least 40%, such as at least 45%, such as over at least 50%, such as at least 55%, such as at least 60%, such as at least 65%, such as over at least 70%, such as at least 75%, such as at least 80%, such as at least 85%, such as over at least 90%, such as at least 95% of a circumference of the elevated element and/or the hole, in a predetermined plane, the maximum distance between the elevated element and the hole, such as when determined perpendicular to a surface of the hole, is no more than 0.5 mm, such as no more than 0.4 mm, such as no more than 0.3 mm, such as no more than 0.25 mm, such as no more than 0.2 mm, such as no more than 0.15 mm, such as no more than 0.1 mm, such as no more than 0.05 mm.

In one embodiment, the method further comprises the step of providing the elevated elements, the providing step comprising:
  forming a carrier element comprising therein or thereon electrical conductors,
  forming the elevated conducting elements in a growing step.

This growing step may be a step used during standard print board production, whereby, advantageously, the elevated elements form part of the transducer and in particular a part of the transducer also comprising an print board or another type of processor or circuit. In one embodiment, the elevated elements form part of an element on which the processor or circuit is also formed, and the growing step of growing the elevated elements may be a step also generating or forming part of the processor/circuit.

Alternatively to the growing step, the elevated elements may be formed as separate elements subsequently fixed to the transducer or conductive element.

In one embodiment, the fixing step is a press fitting step. As mentioned above, this is obtained when the elevated element and the pertaining hole have dimensions ensuring that the outer surface of the elevated element engages the hole either during introduction or subsequent to a further step where the elevated element is deformed or processed to have an increased outer dimension. This processing may be a deformation where parts of the elevated element are forced away from a central portion so that outer portions of the elevated element are forced toward the hole wall.

Naturally, another alternative would be to deform the conductor element to e.g. narrow a hole in at least one direction.

In one embodiment, the fixing step is a soldering step. Thus, molten metal is added to the hole while the elevated element is present therein. When this metal cools and solidifies, the elevated element is fixed in the hole and an electrical connection is obtained.

Naturally, even though it is usually preferred to use the same manner of fixation in all pairs of elevated element and hole, this is not required.

In one situation, the fixing step is a spot-welding step. In this situation, elevated elements are provided with a bit of solder material on top of the element and the provided material is melted.

An alternative to the soldering and spot welding is the use of an electrically conductive glue or other conductive, fluid material. Also, a deformable element may be provided, such as a deformable paste, a foam or the like, which may be added to contact the elevated element and the hole surface, such as in a space between these two elements, to attach the elevated element to the conductor element. This deformable element may be forced into a space between the hole and elevated element if desired.

In a particularly interesting embodiment, a height of at least one elevated element is lower than a depth of the pertaining hole. Thus, when the elevated element is fully introduced into the hole, a space is present in the hole and above the elevated element. This space may be used for holding or introducing the above solder/glue/deformable element or the deforming element, if the elevated element is to be deformed. This space may be advantageous in that dispensing liquid/material into a space or hole may be easier than dispensing to a more plane surface, and in particular when it is desired to limit the extent of the solder/glue etc. dispensed. Furthermore, when the elevated element does not tightly in the hole, a small interstice may be present between the sides of the elevated element and the hole. Then the solder will be impeded from fully flowing away from the space above the elevated element due to capillary forces. A trapezoid shape of the elevated elements would allow both press-fit and the advantageous exploitation of capillary forces on the sides.

In this respect, the height of the elevated element is a height along e.g. an axis of symmetry of the elevated element and/or a height perpendicular to a surface on which the elevated element is provided or positioned.

Similarly, the depth of the hole may be determined as a shortest distance between the two openings of a through-going bore and a distance from an opening to the bottom of a blind bore. Additionally or optionally, the depth may be the depth along an axis of symmetry of the hole and/or a depth along an axis perpendicular to a surface in which an opening of the hole exists.

The height of the elevated element of a pair may be 10-99%, such as 20-99%, such as 30-98%, such as 50-97%, such as 60-95%, such as 70-94% of the depth of the pertaining hole.

This embodiment may be combined with the above embodiment in which the distance between the elevated element and the hole surface supports transport of the solder/glue/liquid by capillary forces, which liquid may be added to the space above the elevated element to be contained thereby during dispensing and during transport due to capillary forces.

In one embodiment, such as during the above soldering or gluing steps, the elevated elements may maintain a shape thereof. Thus, the elevated elements are provided and used for easy registering between the conductive element and the transducer, but the actual fixing is performed—at least partly—by the action of the added solder/glue/liquid/deformable material.

If the fixing step is a soldering, the elevated elements will then not melt but will maintain their shapes during the soldering and will thus be an element to which the solder attaches.

This embodiment is advantageously combined with the embodiment where the height of the elevated element is lower than the depth of the hole, so that the solder/liquid/glue/deformable element may be introduced via the space in the hole but above the elevated element. This manner of providing/dispensing is quite simple.

In an alternative embodiment, the elevated elements are made of the deformable element, whereby the elevated element may be higher than the hole depth in order to facilitate the deformation thereof. If the deformation is caused by heating, such as the melting of solder, the heating thereof is made easy, if the elevated element extends out of the other opening of a through-going bore, so that it may be contacted by a soldering iron or other heating element without contacting the conductor element/transducer.

Alternatively, the deformation may be a physical deformation, such as where the elevated element is compressed in the height direction, which is also easier when the elevated element extends out of the other opening of a through-going bore.

In one situation, the overall volume of the elevated element may be identical to or larger than a total volume of the hole, so that the elevated element when deformed engages a large portion of the inner surface of the hole, if deformed and constricted, to a large degree, to the volume of the hole, such as if forced into the hole during the deformation. In this respect, molten solder is, for example, forced into the hole by gravity, if the hole is directed correctly.

In a number of the above embodiments, it could be advantageous to provide elements preventing the solder/liquid/glue/deformable element from extending from one pair of an elevated element and a hole to another pair, as this may cause a short circuit.

Such elements may simply be resilient seals, such as resilient elements encircling the elevated elements on a surface on which the resilient elements are provided or resilient elements encircling an opening of a hole.

Alternatively, in the situation where the liquid/solder/glue is guided by capillary forces, a space between the resilient element and the transducer may, outside of the holes, either be so narrow that no transport is possible even due to capillary forces, or the distance may be so large that transport due to capillary forces is not possible. In this respect, it may be desired that the elevated elements are provided on a first surface (of one of the transducer and conductor element) and the holes open into a second surface (of the other of the transducer and the contacting element) and that a distance between the first and second surfaces, during the fixing step, exceeds 0.1 mm, such as exceeds 0.15 mm, such as exceeds 0.2 mm, such as exceeds 0.25 mm, such as exceeds 0.3 mm, such as exceeds 0.35 mm, such as exceeds 0.4 mm, such as exceeds 0.45 mm, such as exceeds 0.5 mm, such as exceeds 0.55 mm, such as exceeds 0.6 mm, such as exceeds 0.65 mm.

It is noted that if a part of an elevated element is not introducible in the hole, such as if its dimensions or shape cannot be fitted in the hole, this part of the elevatable element is not relevant and may in many situations not take part in e.g. the height of the elevatable part, as the extent of the elevatable part in the hole is usually only defined by the part thereof which may, in fact, extend into the hole.

A second aspect of the invention relates to a connector assembly comprising a connector element and a conductor element,
  one of the connector element and the conductor element comprising one or more holes and conducting parts, each conducting part being exposed in or at a hole and
  the other of the connector element and the conductor element comprising a plurality of elevated, electrically conducting elements,
  the one or more holes comprising positioning and non-positioning holes.

Naturally, the conductor element may be that described in relation to the first aspect of the invention, and the conducting parts, holes etc. may also be those or like those of the first aspect of the invention.

Also, the comments made in relation to the first aspect are equally relevant to the second aspect of the invention.

In this respect, a positioning hole is a hole which is at least not circular in a cross section perpendicular to a longitudinal axis of the hole.

In a preferred embodiment, the positioning hole is not rotationally symmetric around the axis. In other embodiments, the angular difference between axes of symmetry, in the plane perpendicular to the axis of the hole, are sufficiently large for a positioning to be correct.

In a cross section perpendicular to an axis (longitudinal axis and/or perpendicular to a surface in which the hole is made or perpendicular to a surface of a material forming the hole) the hole may have the shape as an oval, a triangle, a rectangle, a square, a pentagram or any other geometrical shape different from a circle, including more special shapes such as star shape, pie shape or the like.

A positioning hole may have the same or close to the same cross section, perpendicular to the axis, as the pertaining elevated conducting element, so that the pertaining elevated element is not able to rotate a full circle within the hole.

A non-positioning hole may be a hole with a circular cross section or a hole having dimensions, compared to those of the pertaining elevated conducting element, allowing the elevated conducting element to rotate a full circle while positioned in the hole.

In one embodiment, the holes are arranged in an auto-alignment pattern. In this respect, an auto-alignment pattern is a pattern which is not rotationally symmetric in a plane perpendicular to the axes of the holes.

Naturally, the connector element is part of a transducer, such as is seen in the first aspect of the invention.

BRIEF DESCRIPTION OF THE DRAWINGS

In the following, preferred embodiments of the invention are described with reference to the drawing, wherein.

DETAILED DESCRIPTION OF PREFERRED EMBODIMENTS

Figure 2:
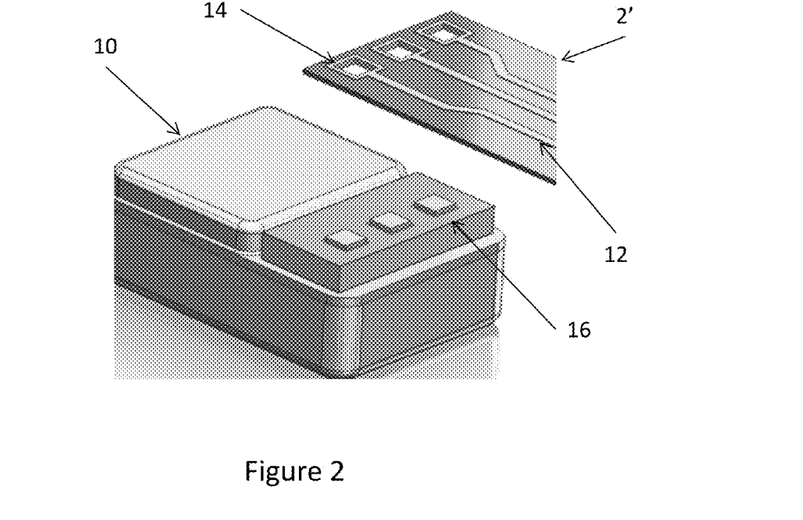
FIG. 2 illustrates a method according to the invention—before electrical connection is made.

FIG. 2 illustrates an assembly, before assembly, suitable for the method of the invention, where the transducer 10 has solder bumps or solid bumps 16 and the connector, in this situation also a flex print 2', has conductors 12 each surrounding a hole 14.

The difference from FIG. 1b) is that in FIG. 2, the bumps 16 fit inside the openings 14, so that a swift and secure register may be obtained between the bumps 16 and the openings 14.

Thus, the method may simply be positioning the bumps 16 in the holes 14. This may be a press-fit or a click fit. Alternatively, the bumps 16 may be smaller in area than the holes 14. The result is a swift register (also called "Auto-aligning") which may even be acknowledged or sensed by a click or the like.

It is noted that in this set-up, pressure is only required along one direction to keep the alignment/register before and during soldering/fastening.

It is preferred that the bumps 16 are made slightly lower than the flex-thickness and that they have a flat top to yield a fairly flat contact surface which is easily accessible for flux/paste dispensing and which makes visual check during and after the application possible. If the fit between the flex-holes 14 and bumps 16 is reasonably tight, less flux is needed, and capillary forces will keep the flux in the area between the hole 14 and bump 16, preventing it from flowing into the space between the bumps 16.

Figure 3:
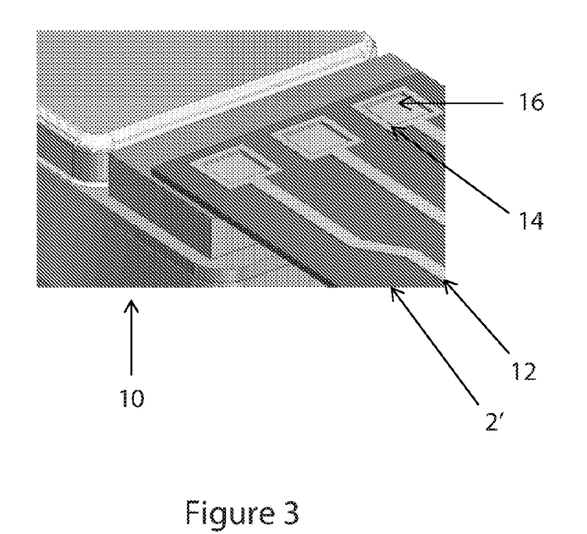
FIG. 3 illustrates the method of FIG. 2, where electrical connection is made and before soldering.

In FIG. 3, the assembly is seen where the bumps 16 are provided in the holes 14.

In one embodiment, the bumps 16 are made of solder which is desired melted for providing the electrical contact or fastening. In this situation, the bumps 16 may have a larger, smaller or equal height to the depth of the hole 14 in the flex 2'.

Figure 4:
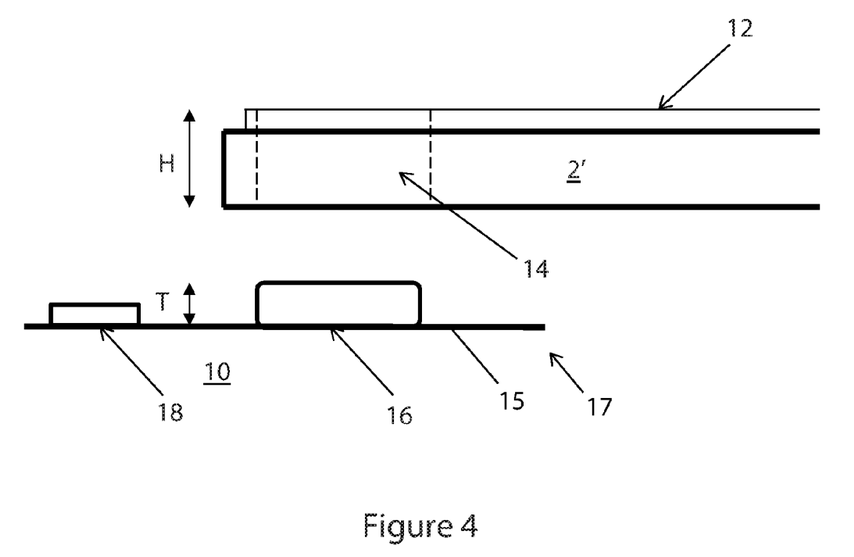
FIG. 4 is a cross sectional view of the embodiment of FIG. 2.

In FIG. 4, the flex 2' is seen from the side with the conductor 12 thereon and with the hole 14 indicated. The flex height is H. The transducer is illustrated with a solder bump 16 having rounded upper edges for easier introduction into the hole 14 in the present situation where, in the plane of the upper transducer surface and perpendicularly to the drawing, the cross section of the bump 16 and the hole 14 are very similar, so that a narrow fit is obtained. Thus, only a narrow gap, if any, is provided between the bump 16 and the hole 14. The bump has a height T.

When the bump 16 is made of solder, it may be made thicker than the hole height (T>H), if desired.

In FIG. 4, a chip 18 is illustrated which is formed on the same carrier substrate 15 as the bump 16. In one embodiment, the chip is manufactured as a print board 17 due to a number of layer growing steps. In one embodiment, the bump 16 is provided during one or more such growing steps during which an amount of material is fed to the bump position in order to generate the bump 16, so that the chip 18 and bump 16 are generated during the same steps.

In another embodiment, the bumps 16 are made of a material with a melting temperature higher than that of the solder, so that the bumps 16 do not melt during the soldering. Then, where the top surface of the solid bumps 16 is below the flex-surface (T<H), it is easy to apply the flux and/or solder and subsequently apply enough heat locally to melt all solder/flux simultaneously. This results in faster soldering with less heat applied. In addition, all of the wetting area may be easily accessible for solder-heat (or weld) and optical feedback. Also, the bumps and holes may be dimensioned so that melted solder and/or flux is kept locally due to capillary force between solid bump and flex-hole.

Due to the register between the bumps and holes, and where the solid bumps do not melt during soldering, the flex will automatically stay level during soldering.

Even though it is preferred that the outer contour of the solder bumps, in a plane of a lower surface of the flex when registering, closely fits that of the holes, so that capillary forces will keep solder/flux in the interface between the holes and bumps, and/or so that a press fitting may be obtained, a larger difference may be used.

It is noted that, clearly, the precision in the positioning of the bumps in relation to the holes will depend on the fit between the holes and bumps as well as the distance from the pertaining hole/bump pair to a centre between the two most spaced hole/bump pairs. Thus, if the same hole/bump dimensions were used, the two most spaced hole/bump pairs would define this precision, and, usually, if the bumps and holes of these two outermost pairs were positioned correctly in relation to each other, all other pairs would also be positioned correctly.

Thus, it may not be required that all hole/bump pairs provide e.g. a narrow fit or a press fit, as this fit in relation to only one or two pairs could render the remaining pairs correctly positioned.

As mentioned, it may be desired to provide the bumps with rounded upper surfaces in order to facilitate the providing of a bump into the pertaining hole, and especially if the contours thereof fit closely to each other. In this respect, the above, flat upper surface (surface facing upwardly in the hole), may be replaced by a pointed or rounded surface to make the registering even easier or to provide a larger surface for e.g. solder or glue to attach to. This upper surface thus may be smooth or uneven, depending on the actual use.

In order to allow the capillary forces to contain the flux/solder/glue, the distance between the bump and the hole of the bump/hole pair, in the plane, should, over a majority of the circumference of the bump, be chosen in relation to the viscosity of the material applied.

In general, it is desired that, in the plane, the cross section of the bump fits within (not exceeding but may touch) the contour of the hole. The overall area of the cross section of the bump may be 50-100% of that of the hole, such as 60-100%, preferably 70-100%, such as 80-100%.

Above, it is preferred, at least for the bumps made of non-melting materials, that the height of the bump is smaller than a depth of the hole. In this respect, the height of the bump is a height from a tip thereof being positioned the farthest from the transducer (in a direction perpendicular to the plane) and to either a base of the bump or a part of the bump having dimensions larger than the hole, so that no more of the bump can be positioned within the hole. Also, the hole depth is a distance, perpendicular to the plane, from one surface of the flex to an opposite side thereof—where the hole opens into the two sides.

Preferably, the bump height is 50-75% of the hole depth, depending on the viscosity of the material to be applied.

Naturally, the bumps and holes may be interchanged so that the flex has the bumps and the holes are provided in the transducer. In the situation where heat is desired to the part of the hole not filled with the bumps, the holes may be provided in an extending ("ledge-shape") part of the transducer. Alternatively, the fixing may be provided by glue, which may be dispensed into the holes, which may then be blind bores, into which the bumps are subsequently provided.

The above flex print may be replaced by any other type of element comprising the holes, including non-flex print materials. Naturally, the present invention mainly relates to electrical connections to a transducer, so that electrical elements preferably are present on the flex print or alternatives thereto, but other than that, any type of element, stiff, flexible, soft, resilient or not, may be used. As will be mentioned below, the holes may be through-going or not, depending on the situation. Thus, it may be desired that the flex print or alternative has an overall thickness corresponding to the desired hole depth, but this it not a requirement, even if through-going holes are desired.

The above description has focused on the use of soldering for fixing the flex to the transducer and in order to provide electrical connections. Alternatives do, however, exist in the form of e.g. welding techniques used in much the same manner as soldering.

Another alternative would be to use a glue, such as an electrically conducting glue. This glue may be prevented, as the above solder/flux, from travelling to the surface between neighbouring bumps and/or holes, by the capillary forces. Also, as no heating may be required when using a glue, the holes need not be through-going holes providing access from one side to the bumps and to the other for solder/heat. Using glue, the holes may be blind, if the glue may be dispensed on the bumps or in the holes prior to the providing of the bumps in the holes. Naturally, through-going holes may also be used when using glue, which may then be dispensed in the same manner as the solder.

Figure 5:
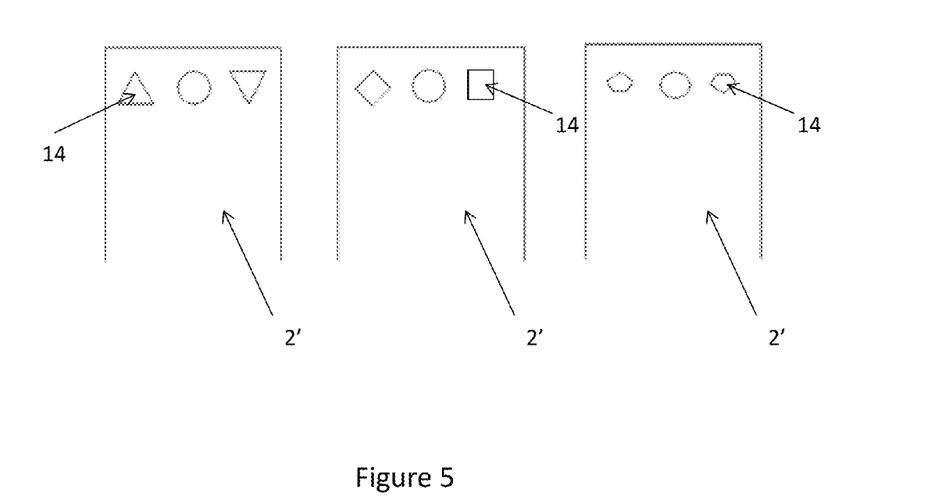
FIG. 5 is a topview of an embodiment of a conductor element.

In the above embodiments the conductor element is to be fixed to a connecting portion of a transducer. In another embodiment, a connecting portion may also be provided separately as part of a connector assembly. Such a connector assembly comprises a connector element containing elevated, electrically conducting elements such as solder bumps and the conductor element as described previously containing one or more holes. To facilitate alignment of the connector element and the conductor element, the shape of the mating holes and bumps as seen in top view may be chosen to be a form-locked: e.g. a triangular, square or pentagonal shape as shown in FIG. 5. Providing the holes 14 with different orientations as shown in FIG. 5, allows positioning of the conductor element viz. the flex print 2', and the connector element in a single configuration. This assures correct connection of the connector during assembly. With a plurality of holes not all holes are required to provide this functionality and hence, positioning holes and non-positioning holes are present.

Figure 6:
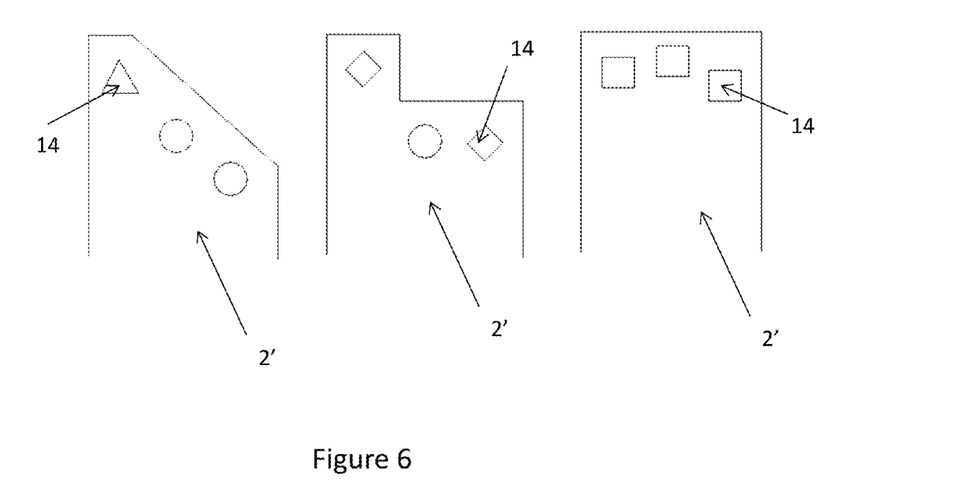
FIG. 6 is topview of another embodiment of a conductor element.

In another embodiment in FIG. 6, the single configuration assembly is enforced by arrangement of the bumps and holes 14 in an auto-alignment pattern. This can be any pattern that allows assembly of the conductor element and the connector element in a single configuration only. The connector element of the connector assembly may of course be part of a transducer as previously described above.

The invention claimed is:

1. A method of assembling a transducer assembly comprising a transducer and a conductor element, the transducer including a print board, wherein:
   the conductor element comprises a plurality of holes and conducting parts, each conducting part being exposed in or at a hole and
   the transducer comprises a plurality of elevated, electrically conducting elements, the method comprising the steps of:
   aligning the conductor element and the transducer so that each of the elevated elements extends into a separate hole of the holes
   fixing the transducer to the conductor element by fixing each elevated element to the conducting parts of the pertaining hole
   providing the elevated elements, the step of providing comprising:
   forming a carrier element comprising therein or thereon electrical conductors, and
   forming the elevated elements in a growing step used during the production of the print board.

2. A method according to claim 1, wherein the fixing step is a press fitting step.

3. A method according to claim 1, wherein the fixing step is a soldering step.

4. A method according to claim 1, wherein the fixing step is a spot-welding step.

5. A method according to claim 1, wherein a height of at least one elevated element is lower than a depth of the pertaining hole.

6. A method according to claim 1, wherein the fixing step is a soldering step comprising adding solder to at least one of the holes.

7. A method according to claim 6, wherein, during the soldering step, the elevated elements maintain a shape thereof.

8. The method according to claim 1, wherein the aliging results in swift registration or auto-alignment of each elevated element within the corresponding hole of the holes.

9. The method according to claim 8, wherein a thickness of the elevated elements is slightly lower than a height of the print board.

10. The method according to claim 9, wherein the elevated elements have a flat top surface to yield a generally flat contact surface when fixed to the conducting parts of the pertaining hole of the holes.

11. The method according to claim 10, wherein capillary forces keep soldering flux in an area between each of the elevated elements and the corresponding hole of the holes, thereby preventing an electrically conductive fluid or liquid or molten metal from flowing into a space between adjacent ones of the elevated elements.

12. The method according to claim 1, wherein the elevated elements and the electrical conductors formed in or on the carrier element are composed of the same material.

13. The method according to claim 1, wherein capillary forces keep soldering flux in an area between each of the elevated elements and the corresponding hole of the holes, thereby preventing an electrically conductive fluid or liquid or molten metal from flowing into a space between adjacent ones of the elevated elements.

14. The method according to claim 1, wherein a thickness of the elevated elements is slightly lower than a height of the print board.

15. The method according to claim 1, wherein the elevated elements have a flat top surface to yield a generally flat contact surface when fixed to the conducting parts of the pertaining hole of the holes.

16. A connector assembly comprising a connector element and a conductor element, wherein the connector element is part of a transducer, the transducer including a print board,
   the conductor element comprising one or more holes and conducting parts, each conducting part being exposed in or at a hole and
   the transducer comprising a plurality of elevated, electrically conducting elements, wherein the elevated elements form part of the transducer including the print board and are formed with a carrier element comprising therein or thereon electrical conductors in a growing step used during the production of the print board, and the conductor element and the transducer are aligned so that each of the elevated elements extends into a separate hole of the one or more holes,
   each of the one or more holes is one of a positioning or a non-positioning hole.

17. A connector assembly according to claim 16, wherein the holes are —arranged in an auto-alignment pattern.

* * * * *